(12) United States Patent
Gomez et al.

(10) Patent No.: US 7,778,617 B2
(45) Date of Patent: Aug. 17, 2010

(54) THREE STAGE ALGORITHM FOR AUTOMATIC GAIN CONTROL IN A RECEIVER SYSTEM

(75) Inventors: Ramon Alejandro Gomez, San Juan Capistrano, CA (US); Stephen Krafft, Los Angeles, CA (US); Tommy Yu, Orange, CA (US)

(73) Assignee: Broadcom Corporation, Irvine, CA (US)

( * ) Notice: Subject to any disclaimer, the term of this patent is extended or adjusted under 35 U.S.C. 154(b) by 515 days.

(21) Appl. No.: 11/898,614

(22) Filed: Sep. 13, 2007

(65) Prior Publication Data

US 2008/0242249 A1 Oct. 2, 2008

Related U.S. Application Data

(60) Provisional application No. 60/920,824, filed on Mar. 30, 2007.

(51) Int. Cl.
*H04B 1/06* (2006.01)
(52) U.S. Cl. .............. 455/234.1; 455/234.2; 455/226.2; 455/67.11; 455/67.13; 375/345; 375/346
(58) Field of Classification Search .............. 455/234.1, 455/234.2, 226.2, 67.11, 67.13; 375/345, 375/346
See application file for complete search history.

(56) References Cited

U.S. PATENT DOCUMENTS

| | | | | |
|---|---|---|---|---|
| 6,370,370 B1 * | 4/2002 | Roth et al. | .................. | 455/307 |
| 6,498,927 B2 * | 12/2002 | Kang et al. | ............... | 455/245.2 |
| 7,242,915 B2 * | 7/2007 | Shi | ......................... | 455/232.1 |
| 7,630,686 B2 * | 12/2009 | Fukutani et al. | ............ | 455/63.1 |

* cited by examiner

*Primary Examiner*—Sanh D Phu
(74) *Attorney, Agent, or Firm*—Sterne, Kessler, Goldstein & Fox P.L.L.C.

(57) ABSTRACT

In an embodiment, a receiver for processing a RF input signal having a variable signal strength includes an RF amplifier, an IF amplifier, and a controller. The RF amplifier is configured to receive and amplify the RF input signal. The IF amplifier is coupled to an output of the RF amplifier. The controller controls gains of the RF amplifier and the IF amplifier during times of falling signal strength. A gain of the IF amplifier is increased as the signal strength falls until a first amplitude threshold is reached for the falling signal strength. If the signal strength falls beyond the first threshold, a gain of the RF amplifier is increased until a second amplitude threshold is reached. The second amplitude threshold is lower than the first amplitude threshold. If the signal strength falls below the second amplitude threshold, the gain of the IF amplifier is further increased.

24 Claims, 6 Drawing Sheets

THREE STAGE ALGORITHM FOR AUTOMATIC GAIN CONTROL IN A RECEIVER SYSTEM

CROSS REFERENCE TO RELATED APPLICATIONS

This application claims benefit of U.S. Provisional Patent No. 60/920,824 filed Mar. 30, 2007, which is incorporated by reference herein in its entirety.

FIELD OF THE INVENTION

The present invention is generally directed to communication systems. More particularly, the invention relates to Automatic Gain Control (AGC).

BACKGROUND OF THE INVENTION

A typical communication receiver includes several circuit blocks to process a received signal. The receiver has an antenna which receives a received signal containing a carrier signal that is modulated with a data signal. The received signal is initially amplified by a variable-gain radio frequency (RF) amplifier. After amplification, a mixer mixes the received signal with a local oscillator signal to down-convert the received signal to an IF or baseband signal. The output of the mixer is an intermediate frequency (IF) signal that is modulated with the data signal. A variable-gain IF amplifier further amplifies the IF signal. A low-pass filter then filters the IF signal. The signal is then further amplified by a front-end amplifier before being passed to a demodulator. A conventional receiver also contains a conventional Automatic Gain Control (AGC) circuit that is configured to compensate for amplitude variations in the received signal over time.

The conventional AGC circuit in a receiver attempts to optimally load the front-end amplifier to mitigate changes in received radio frequency signal strength. When the received RF signal strength decreases to a point where the AGC circuit must amplify the received RF signal, the AGC circuit initially amplifies the received RF signal by increasing a gain of the RF amplifier. When the RF amplifier provides maximum amplification, yet additional amplification of the received RF signal is further required, the AGC circuit varies a gain of the IF amplifier to further amplify the received signal.

Unfortunately, when received RF signal strength is so high as to require minimal amplification, the conventional AGC circuit causes the RF amplifier to compress the signal that is input to the front-end amplifier. The compression occurs because the high RF signal strength drives the RF amplifier to the 1 dB compression point. As a result, the front-end amplifier saturates, further distorting the received signal. Thus, the conventional AGC circuit degrades receiver performance when the received RF signal strength is high.

Further, the AGC roles of the RF amplifier and the IF amplifier in the AGC circuit cannot simply be switched to resolve this problem because the IF amplifier has a relatively higher noise figure than the RF amplifier. Thus, if the IF amplifier provides initial AGC gain adjustment, the IF amplifier injects noise into the gain-adjusted RF signal even when the AGC circuit provides only slight amplification. This results in a lower signal-to-noise ratio (SNR) for the receiver when the AGC roles of the RF amplifier and the IF amplifier in the AGC circuit are switched.

Accordingly, what is needed is a circuit and method of automatic gain control that overcomes the shortcomings described above.

BRIEF SUMMARY OF THE INVENTION

In an embodiment, a receiver for processing a radio frequency (RF) input signal having a variable signal strength includes an RF amplifier, an intermediate frequency (IF) amplifier, and a controller. The RF amplifier is configured to receive and amplify the RF input signal. The IF amplifier is coupled to an output of the RF amplifier. The controller controls gains of the RF amplifier and the IF amplifier during times of falling signal strength. A gain of the IF amplifier is increased as the signal strength falls until a first amplitude threshold is reached for the falling signal strength. If the signal strength falls beyond the first threshold, a gain of the RF amplifier is increased until a second amplitude threshold is reached. The second amplitude threshold is lower than the first amplitude threshold. If the signal strength falls below the second amplitude threshold, the gain of the IF amplifier is further increased.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and enable a person skilled in the pertinent art to make and use the invention.

In the drawings.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The invention provides a multi-stage approach to automatic gain control. The figures described below illustrate this approach. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example," etc., indicate that the embodiment(s) described may include a particular feature, structure, or characteristic. However, every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
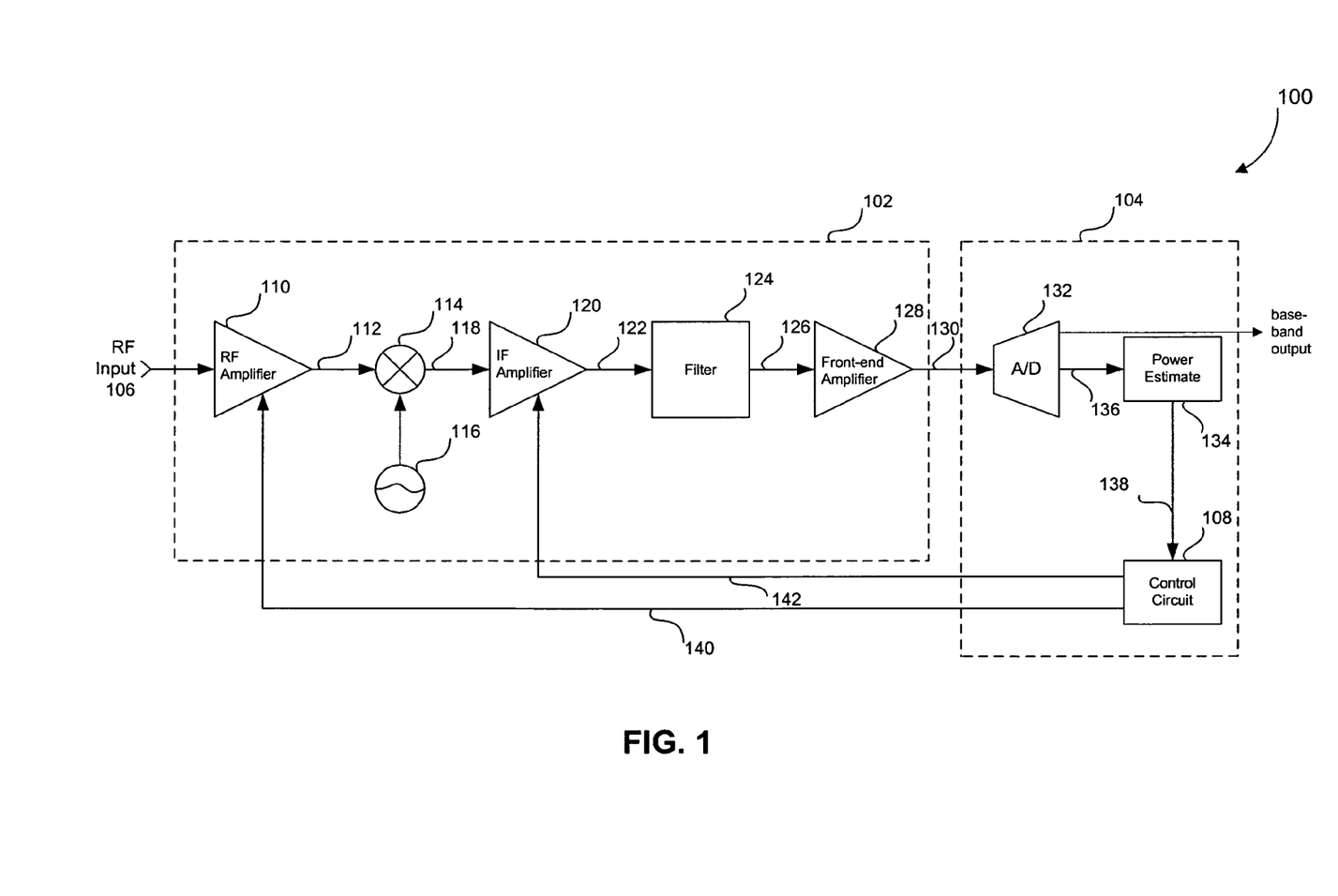
FIG. 1 is a block diagram of a receiver system having automatic gain control (AGC).

FIG. 1 is a block diagram of a receiver system 100 having automatic gain control (AGC). The receiver system 100 has a tuner 102 and a demodulator 104. The tuner 102 selects a channel from a received RF signal on an RF input 106 and outputs a modulated baseband signal. The demodulator 104 recovers an information signal, such as a data signal, from the modulated baseband signal. A control circuit 108 in the demodulator 104 automatically controls amplification of the received RF signal in the tuner 102. The details of the receiver system 100 are further described below.

The tuner 102 selects a channel from the received RF signal on the RF input 106 to produce a modulated baseband signal. The RF input 106 receives the RF signal from, and is coupled to, a communications medium. The communications medium may be at least one of several types of communications media, for example, a coaxial cable, an electrical conductor, a twisted pair, a fiber optic cable, a waveguide, space, and a wireless medium that conveys wireless radio frequency (RF) signals. The RF input 106 may carry an L-band satellite signal or a satellite signal having any other frequency band. The RF input 106 couples the received RF signal to a radio frequency programmable gain amplifier (RF PGA) 110.

The RF PGA 110 is a low-noise, variable gain amplifier that amplifies the received RF signal to provide an RF PGA output 112. In one embodiment, the RF PGA 110 has a broader frequency response and a lower noise figure than an IF PGA 120. For example, the RF PGA 110 has a frequency response of 950-2150 MHz. Gain of the RF PGA 110 is controlled by the control circuit 108. The RF PGA output 112 couples an RF PGA output signal to a mixer 114.

The mixer 114 mixes the RF PGA output signal with a local oscillator (LO) signal created by an oscillator 116. Varying the LO signal frequency selects a channel from the RF PGA output signal. A mixer output 118 containing the selected channel is input to an IF programmable gain amplifier (IF PGA) 120.

The IF PGA 120 is a linear, variable gain amplifier that amplifies the mixer output 118 to provide the IF PGA output signal. The IF PGA 120 has a narrower frequency response than the RF PGA 110. The IF PGA 120 is also less likely, when compared to the RF PGA 110, to compress the mixer output signal. Compression of the mixer output signal leads to saturation of a front-end amplifier 128. The control circuit 108 controls gain of the IF PGA 120. An IF PGA output 122 couples the IF PGA output signal to a filter 124.

The filter 124 is a low pass filer (LPF). Alternatively, the filter 124 may be a bandpass filter. The filter 124 may remove the carrier, undesired images, and other high-frequency RF signals such as high-frequency noise from the IF PGA 120 output signal. The filter 124 provides a filter output signal via a filter output 126 coupled to the front-end amplifier 128. The filter output signal contains the modulated baseband signal from the selected channel. The front-end amplifier 128 amplifies the filter output signal to provide a tuner output signal at a tuner output 130. The tuner output 130 couples the tuner output signal to the demodulator 104.

In an alternative exemplary configuration, the filter 124 is placed before the IF amplifier 120. In other words, the mixer output 118 is coupled to the filter 124 and the filter output 126 is coupled to the IF PGA 120. The IF PGA output 126 is coupled to the front-end amplifier 128.

Still referring to FIG. 1, the demodulator 104 removes the information signal from the modulated baseband signal. More specifically, the tuner output 130 is coupled to an analog to digital (A/D) converter 132 in the demodulator 104. The A/D converter 132 converts the tuner output signal from an analog signal to a digital signal to support demodulation of the modulated baseband signal. Further, an A/D converter output signal is coupled to a power estimate circuit 134 via an A/D converter output 136. The power estimate circuit 134 determines an estimated power of the modulated baseband signal present at the tuner output 130. The power estimate circuit 134 provides the power estimate to the control circuit 108 via a power estimate output 138. The estimated power of the modulated baseband signal present at the tuner output 130 may be substantially proportional to the power of the received RF signal on the RF input 106. Further, changes in the estimated power of the modulated baseband signal present at the tuner output 130 may be substantially proportional to changes in the power of the received RF signal on the RF input 106.

The control circuit 108 automatically controls amplification of the received RF signal in the tuner 102 to load the receiver front-end amplifier 128 for optimal performance by mitigating effects of variation in received RF signal strength. The control circuit 108 processes the power estimate to control the gain of the RF PGA 110 and the gain of the IF PGA 120. The control circuit 108 issues an RF PGA gain control signal via an RF PGA gain control input 140. Further, the control circuit 108 issues an IF PGA gain control signal via an IF PGA gain control input 142. The control circuit 108, and thus the receiver system 100, is configured to perform a method for AGC control as described below.

In an example, to minimize a size of the receiver system 100, at least a part of the receiver system 100 may be implemented in an integrated circuit having a substrate. Thus, at least a part of the receiver system 100 may be deposited on a substrate.

Figure 2:
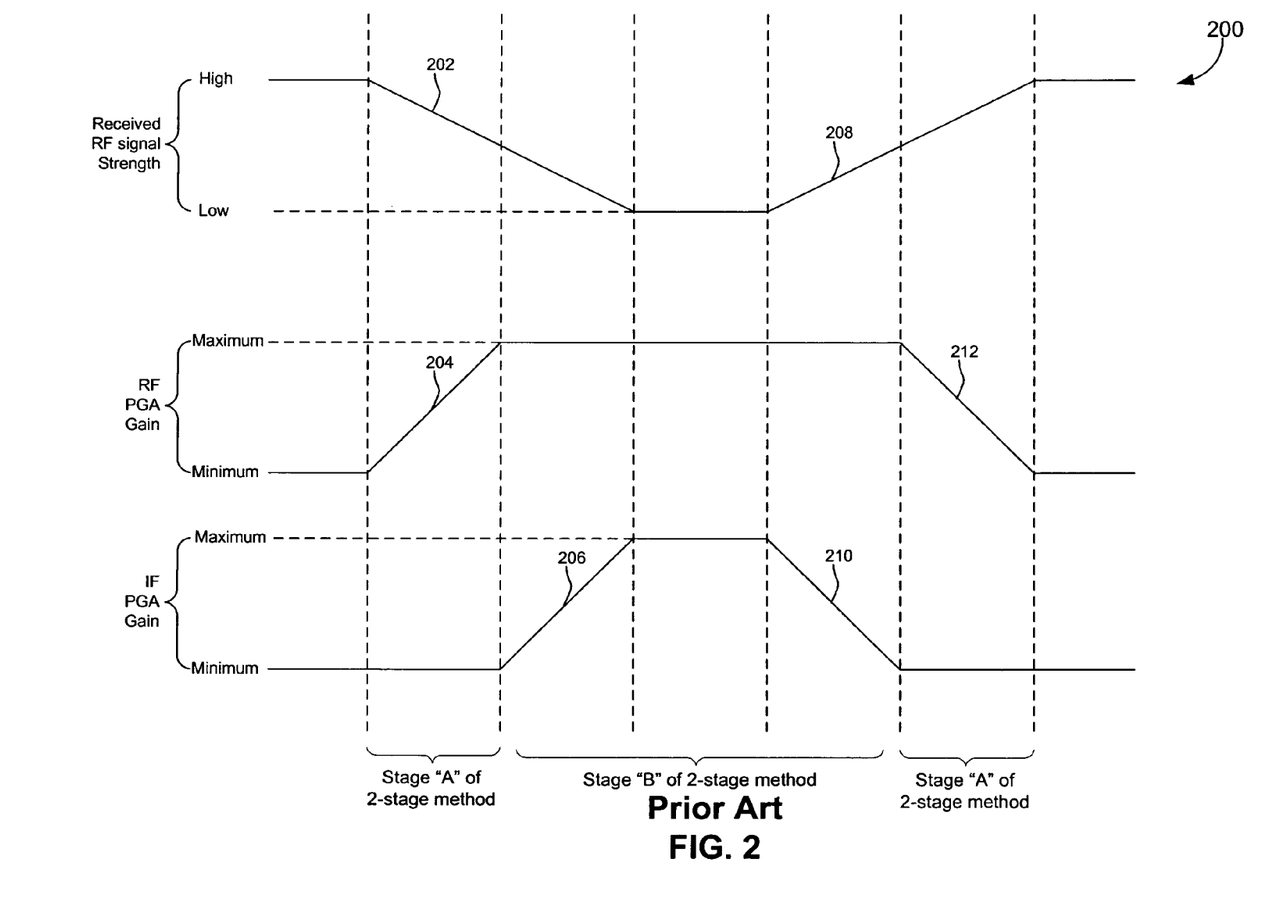
FIG. 2 illustrates AGC using a conventional two-stage AGC method.

FIG. 2 illustrates AGC using a conventional two-stage AGC method 200. For a falling received RF signal strength 202, the two-stage AGC method 200 increases only the gain 204 of an RF PGA from a minimum to a maximum prior to increasing only the gain 206 of an IF PGA from a minimum to a maximum. In other words, when the received RF signal strength decreases to a point where the AGC circuit must amplify the received RF signal, the AGC circuit initially amplifies the received RF signal by increasing a gain 204 of the RF PGA. When the RF PGA provides maximum amplification and the received RF signal strength continues to fall, additional amplification of the received RF signal is further required. The AGC circuit provides the additional amplification by increasing a gain 206 of the IF PGA to further amplify the received signal. This particular conventional order of amplification is performed to preserve noise figure, but has the disadvantages described above regarding saturation.

Still referring to FIG. 2, for a rising received RF signal strength 208, the two-stage method 200 also decreases only the gain 210 of the IF PGA from the maximum to the minimum prior to decreasing only the gain 212 of the RF PGA from the maximum to the minimum. In other words, when the IF PGA is amplifying the received signal and the received RF signal strength increases, the AGC circuit compensates for the increase by first decreasing the gain 210 of the IF PGA to reduce amplification of the received signal. While gain of the IF PGA is being reduced, the RF PGA gain remains at the maximum. When the received RF signal strength increases to a point where amplification by the IF PGA is not required, the AGC circuit reduces the IF PGA gain 210 to the minimum. As the received signal strength continues to increase, the AGC circuit compensates by decreasing the gain 212 of the RF PGA. While the RF PGA gain is being varied, the IF PGA gain remains at the minimum.

Figure 3A:
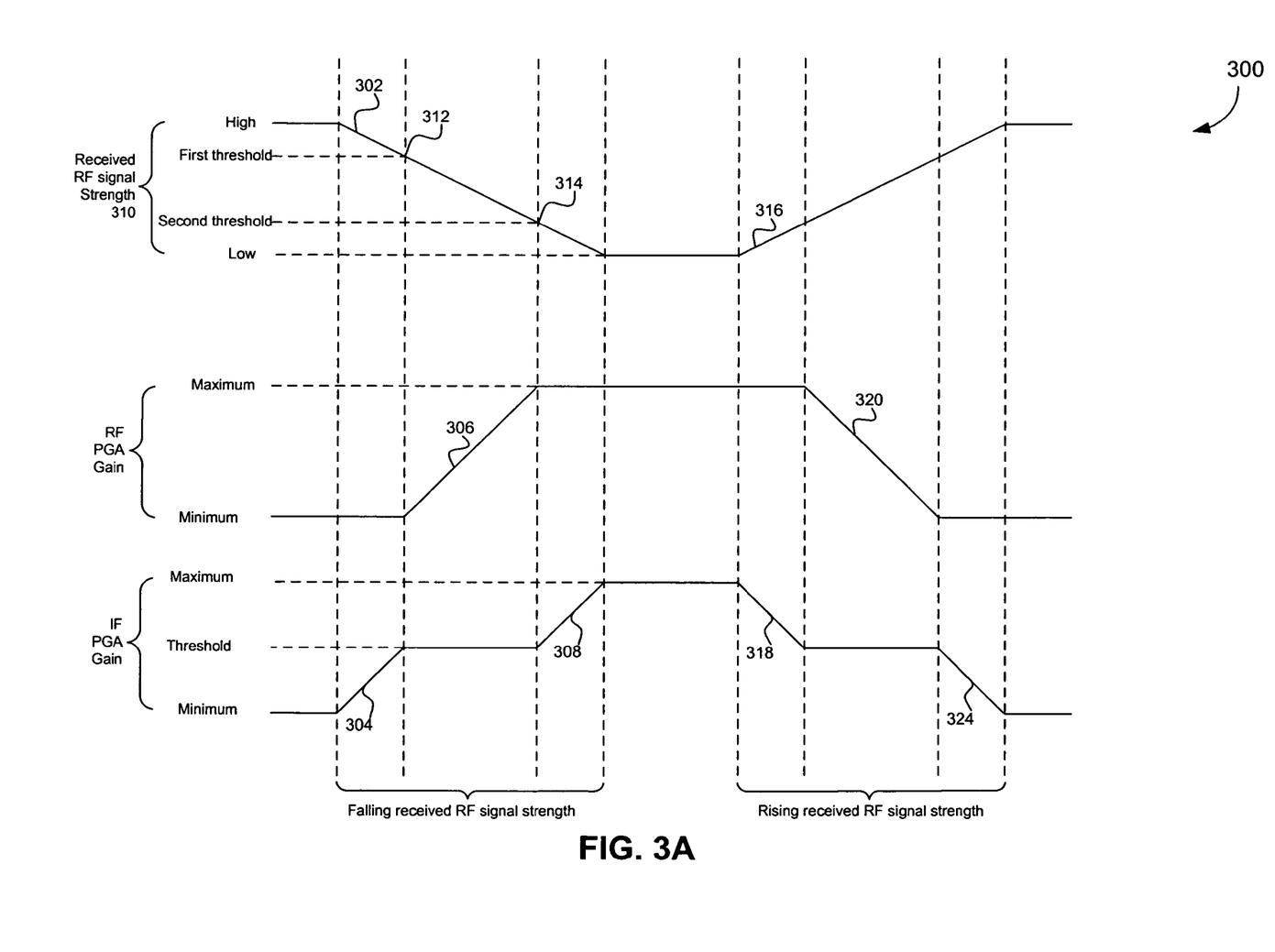
FIG. 3A illustrates exemplary amplifier gain control using a three-stage method.
Figure 3B:
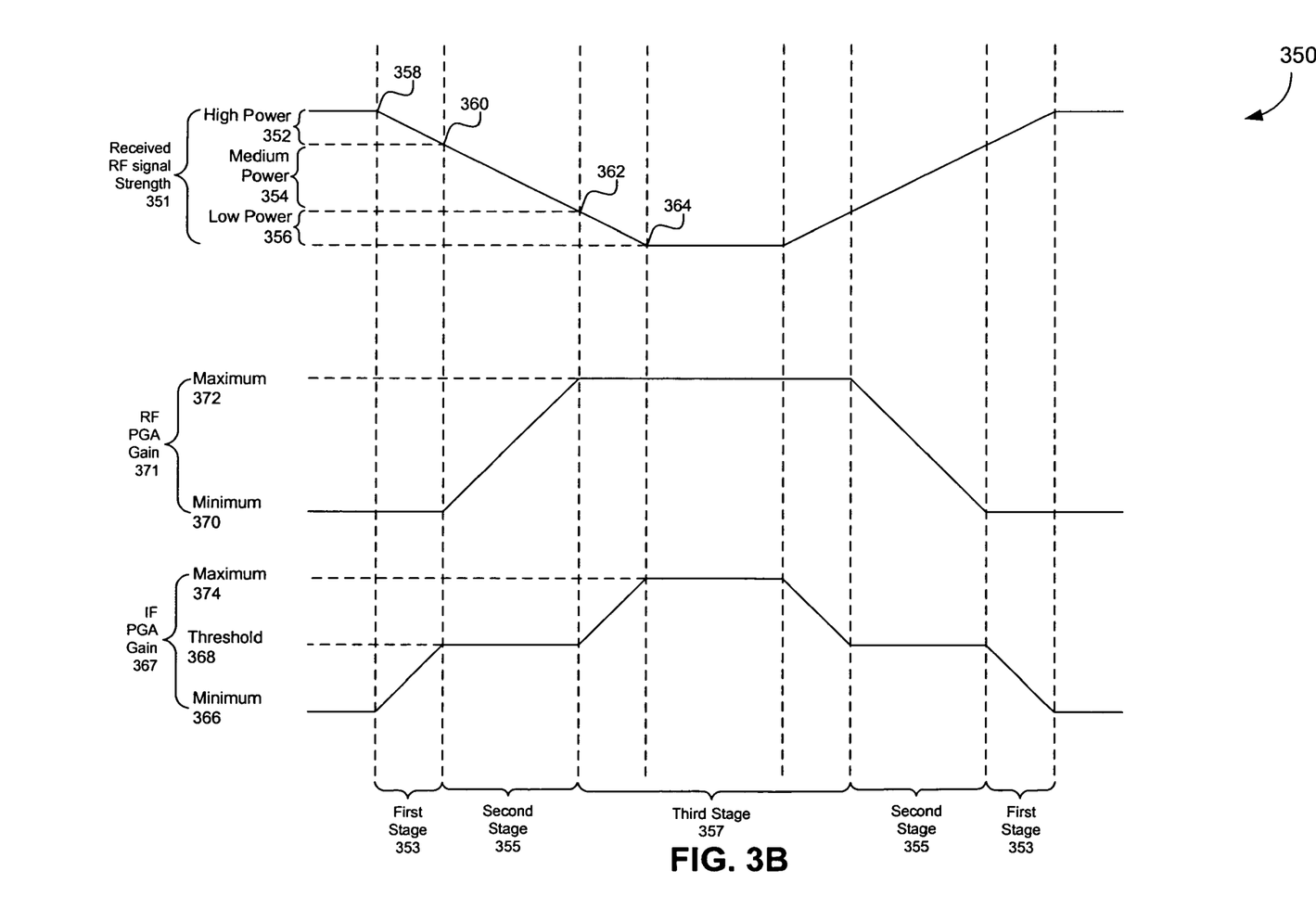
FIG. 3B illustrates exemplary amplifier gain control using a three-stage method.
Figure 4:
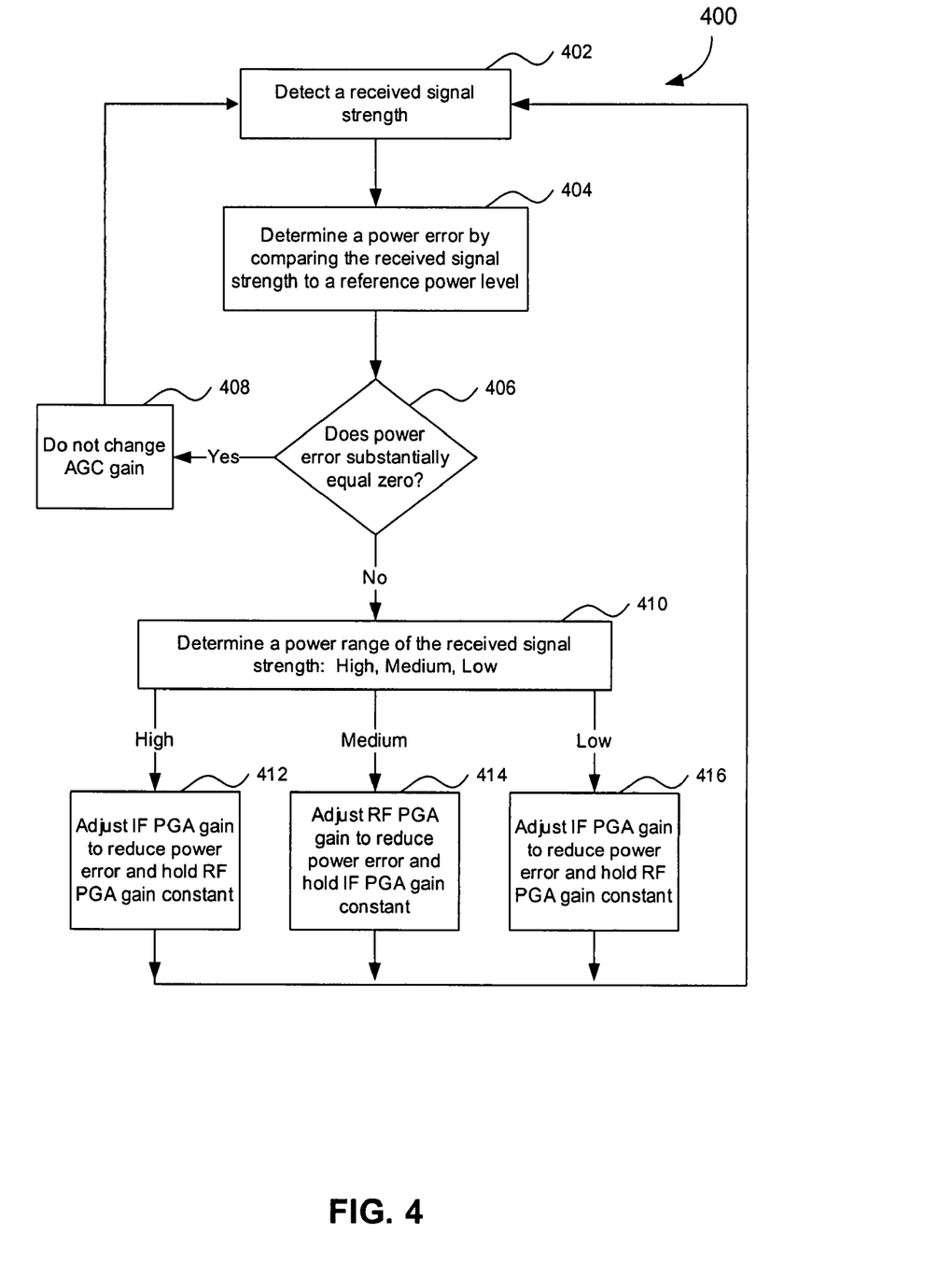
FIG. 4 is a flowchart of a method for amplifier gain control.
Figure 5:
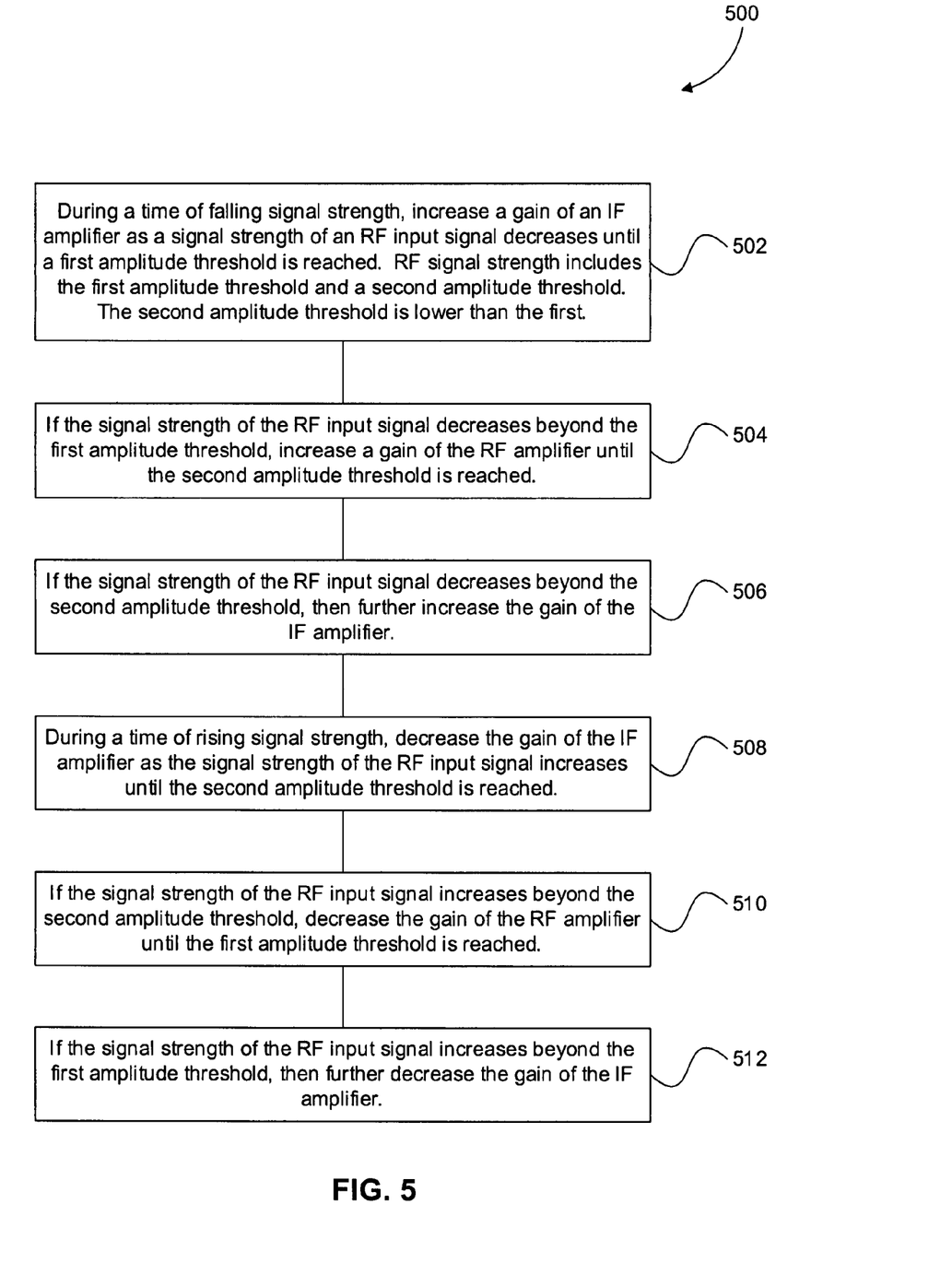
FIG. 5 depicts a flowchart of an exemplary method for amplifier gain control.

Though examples of the methods for receiver gain control may be described in FIGS. 3-5 in the context of the receiver system 100, the methods described in FIGS. 3-5 may be performed by a receiver having an RF amplifier configured to receive an RF input signal with variable signal strength, and an IF amplifier coupled to the output of the RF amplifier.

FIG. 3A illustrates amplifier gain control using a three-stage method 300. The three-stage method 300 mitigates changes in a received RF signal strength 310 to maintain a substantially constant signal level within a receiver circuit, such as at the input to the front-end amplifier 128. Maintaining a substantially constant signal level at the input to the front-end amplifier 128 optimally loads the front-end amplifier 128. The three-stage method 300 also minimizes both signal distortion and noise to provide improved high-power performance with a signal-to-noise ratio (SNR) greater than or equal to that of a conventional receiver.

For a falling received RF signal strength 302, the three-stage method 300 initially increases only the gain 304 of an IF amplifier prior to increasing only the gain 306 of an RF amplifier. After increasing the gain of the RF amplifier, then the three-stage method 300 increases only the gain 308 of the IF amplifier.

In other words, when the received RF signal strength decreases 302, the three-stage method 300 initially amplifies the received RF signal by increasing only a gain 304 of the IF amplifier. When the received RF signal strength 310 reaches a first threshold 312, the three-stage method 300 stops increasing the IF amplifier gain 304. The first threshold is set high enough to minimize noise imparted to the received RF signal by the IF amplifier. The first threshold is set low enough to minimize compression of the received RF signal by the RF amplifier and/or mixer.

When the received RF signal strength 310 decreases below the first threshold 312, then the three-stage method 300 provides additional amplification of the received RF signal by increasing only a gain 306 of the RF amplifier. When the received RF signal strength 310 reaches a second threshold 314, the three-stage method 300 stops increasing the RF amplifier gain 306. The second threshold is determined at least in part by the maximum gain of the RF amplifier.

When the received RF signal strength 310 decreases below the second threshold 314, then the three-stage method 300 provides additional amplification of the received RF signal by increasing only a gain 308 of the IF amplifier. This particular order of amplification is performed to preserve noise figure and minimize compression of the received RF signal.

Still referring to FIG. 3A, for a rising received RF signal strength 316, the three-stage method 300 initially decreases only the gain 318 of the IF amplifier prior to decreasing only the gain 320 of an RF amplifier. After decreasing the gain 320 of the RF amplifier, then the three-stage method 300 decreases only the gain 324 of the IF amplifier.

In other words, when the received RF signal strength increases 316, the three-stage method 300 initially decreases only a gain 318 of the IF amplifier. When the received RF signal strength 310 increases to the second threshold 314, the three-stage method 300 stops decreasing the gain 318 of the IF amplifier. When the received RF signal strength 310 increases above the second threshold 314, then the three-stage method 300 decreases only a gain 320 of the RF amplifier. When the received RF signal strength 310 reaches the first threshold 312, the three-stage method 300 stops decreasing the gain 320 of the RF amplifier. When the received RF signal strength 310 increases above the first threshold 312, then the three-stage method 300 decreases only a gain 324 of the IF amplifier.

FIG. 3B further illustrates amplifier gain control using a three-stage method 350 to mitigate changes in a received RF signal strength 351. The changes in the received RF signal strength 351 are mitigated to maintain a substantially constant signal level within a receiver circuit, such as the input to the front-end amplifier 128. Specifically, FIG. 3B provides a graph that illustrates adjustment of RF PGA gain 371 and IF PGA gain 367, dependent upon a range of RF signal strength 351. The three-stage AGC method 350 divides the received RF signal strength 351 into three power ranges: high power 352, medium power 354, and low power 356. The power ranges are discussed in detail below. The extent of each power range may be substantially different. For example, the high power range 352 may be from 0 dB to −20 dB, an extent of 20 dB, while the medium power range 354 may be from −20 dB to −55 dB, an extent of 35 dB. Other power ranges can be utilized, as will be understood by those skilled in the arts.

The high power range 352 of the RF signal strength 351 defines a first stage 353 of the AGC circuit 108 operation and extends from a high power limit 358 down to a medium power limit 360. The high power limit 358 is a threshold at which the received RF signal strength 351 starts to require amplification to optimally load the front-end amplifier 128.

The adjustment of the IF PGA gain 367 depends on variation in the received RF signal strength 351. In the first stage 353, when the received RF signal strength 351 decreases within the high power range 352, the control circuit 108 increases the gain 367 of the IF PGA 120, and holds the RF PGA gain 371 substantially constant until a first threshold is reached. Further, when the received RF signal strength 351 increases within the high power range 352, the control circuit 108 decreases the gain 367 of the IF PGA 120 and holds an RF PGA gain 371 substantially constant at the minimum RF PGA gain 370 to keep the RF PGA 110 from compressing the received RF signal. The minimum RF PGA gain 370 may be a substantially unity gain or some other value.

Further, an IF PGA gain threshold 368 determines the medium power limit 360. Factors that may contribute to setting the IF PGA gain threshold 368 include: the noise figure of the IF PGA 120, the minimum RF PGA gain 370, and a maximum noise figure of the receiver system 100. There is a design trade-off between signal distortion and noise when determining the IF PGA gain threshold 368. The IF PGA gain threshold 368 is high enough so that when the RF PGA 110 operates at the minimum RF PGA gain 370, the RF PGA 110 does not compress the received RF signal. Compression of the received RF signal is undesirable because it saturates the front-end amplifier 128. Conversely, the IF PGA gain threshold 368 is also low enough so that the IF PGA 120 imparts minimal noise to the received RF signal during operation in the first stage 353. Thus, the receiver system 100 minimizes both signal distortion and noise to provide improved high-power performance with a higher signal-to-noise-plus-distortion ratio (SNDR) than a conventional receiver.

The medium power range 354 of the RF signal strength 351 defines a second stage 355 of control circuit 108 operation and separates the high power range 352 from the low power range 356. The medium power range 354 extends from the medium power limit 360 to a low power limit 362. Thus, the low power limit 362 may be determined by subtracting the extent of the medium power range 354 from the medium power limit 360. The extent of the medium power range 354 is determined at least in part by a dynamic range of the RF PGA 110.

As shown in FIG. 3B, in the second stage 355, the control circuit 108 adjusts the RF PGA gain 371 between the minimum RF PGA gain 370 and a maximum RF PGA gain 372 to mitigate changes in the received RF signal strength 351 and optimally load the front-end amplifier 128. The minimum RF PGA gain 370 may be unity. Minimizing compression of the received RF signal determines at least in part the maximum RF PGA gain 372. In the second stage 355, the RF PGA 110 operates below the 1 dB compression point, such as substantially 10 dB below the 1 dB compression point.

In the second stage 355, the adjustment of the RF PGA gain 371 depends on variation in the received RF signal strength 351. In the second stage 355, when the received RF signal strength 351 decreases within the medium power range 354, the control circuit 108 increases the gain of the RF PGA 110 until the maximum RF PGA gain 372 is reached. Further, when the received RF signal strength 351 increases within the medium power range 354, the control circuit 108 decreases the RF PGA gain 371 until the minimum RF PGA gain 370 is reached. In the second stage 355, the control circuit 108 holds the IF PGA gain 367 substantially constant at the IF PGA gain threshold 368 to minimize noise imparted to the received RF signal by the IF PGA 120.

The low power range 356 of the RF signal strength 35 defines the third stage 307 of control circuit 108 operation and extends from the low power limit 362 down to an AGC maximum power limit 364. Thus, the difference in signal strength between the high power limit 358 and the AGC maximum power limit 364 is substantially equal to the maximum RF PGA gain 372 plus the maximum IF PGA gain 374. The low power range 356 may extend from the low power limit 362 down to a power below the AGC maximum power limit 364. For example, the low power range 356 may extend from the low power limit 362 to a power level of thermal noise present at the RF input 106.

Still referring to FIG. 3B, in the third stage 307, the control circuit 108 adjusts the IF PGA gain 367 between the IF PGA gain threshold 368 and the maximum IF PGA gain 374 to mitigate changes in the received RF signal strength 351 and optimally load the front-end amplifier 128. The adjustment of the IF PGA gain 367 may be an increase or a decrease, dependent upon variation in the received RF signal strength 351. In the third stage 307, when the received RF signal strength 351 decreases within the low power range 356, the control circuit 108 increases the gain of the IF PGA gain 367 as needed until the maximum IF PGA gain 374 is reached. Further, when the received RF signal strength 351 increases within the low power range 356, the control circuit 108 decreases the gain of the IF PGA gain 367. In the third stage 307, the control circuit 108 holds the RF PGA gain 371 substantially constant at the maximum RF PGA gain 372.

FIG. 4 illustrates a flowchart of amplifier control using a three-stage AGC method 400, as a further interpretation of the AGC method described in FIGS. 3A and 3B. At least a part of the three-stage AGC method 400 may be performed by the receiver system 100. The three-stage AGC method 400 balances addition of noise to the received RF signal by an IF PGA with compression of the received RF signal by an RF PGA.

In step 402, a received signal strength is detected. The received signal strength may be calculated from the estimated power of the baseband signal present at the tuner output 130 plus AGC gain. Further, the received signal strength may be the estimated power of the received RF signal present at the RF input 106. In an example, a change in received signal strength may be detected. In step 404, a power error is determined by comparing the received signal strength to a reference power level. In an example, a power error is determined by comparing the change in received signal strength to the reference power level. In step 406, the power error is compared to a substantially zero value. Alternatively, the power error is compared to a range of acceptable power errors. If the power error is substantially zero and/or within tolerance, then step 408 is executed. In step 408, AGC gain is not changed and the step 402 is executed. If the power error is not substantially zero and/or within a tolerance, then step 410 is executed. In step 410, a power range of the received signal strength is determined. The power ranges are the high range 352, the medium range 354, and the low range 356. The high range 352 may overlap the medium range 354. The medium range 354 may overlap the low range 356. The high range 352 and the low range 356 do not have any common values of received signal strength.

If the power range is determined to be the high power range 352, then step 412 is executed. In the step 412, the IF PGA gain 367 is adjusted to reduce the power error. The RF PGA gain 371 is held constant. In step 412, the IF PGA gain 367 is adjusted to a magnitude between a minimum IF PGA gain 366 and a threshold gain 368. The IF PGA gain 367 is adjusted in the high power range 352 to prevent the front end amplifier 128 from saturating. If the received signal strength increases while the AGC circuit 108 provides minimum AGC gain, then the AGC circuit 108 may provide a gain of substantially unity gain or some other value.

If the power range is determined to be the medium power range 354, then step 414 is executed. In the step 414, the RF PGA gain 371 is adjusted to reduce the power error. The IF PGA gain 367 is held substantially constant. In step 414, the RF PGA gain is adjusted to a magnitude between a minimum RF PGA gain 370 and a maximum RF PGA gain 372. The RF PGA gain 371 is adjusted in the medium power range 354 to minimize introduction of noise into the amplified signal and thus maximize signal-to-noise ratio (SNR) or the receiver 100. In the medium power range 354, the RF PGA gain 371 may increase without saturating the front end amplifier 128.

If the power range is determined to be the low power range 356, then step 416 is executed. In the step 416, the IF PGA gain 367 is adjusted to reduce the power error. The RF PGA gain 371 is held substantially constant at the maximum RF PGA gain 372. In step 412, the IF PGA gain 367 is adjusted to a magnitude between the threshold gain 368 and the maximum IF PGA gain 374. The IF PGA gain 367 is adjusted in the low power range 356 to maximize AGC gain and thus maximize loading of the front-end amplifier 128 without saturating front-end amplifier 128. In the low power range 356, when the IF PGA 120 provides maximum IF PGA gain 374, the AGC circuit 108 also provides maximum AGC gain. If the received signal strength decreases while the AGC circuit 108 provides maximum AGC gain, then the dynamic range of the receiver controlled by the AGC circuit 108 is exceeded.

FIG. 5 depicts a flowchart of an exemplary method for amplifier gain control 500. The method for amplifier gain control 500 mitigates changes in a received RF signal strength to maintain a substantially constant signal level within a receiver circuit, such as the input to the front-end amplifier 128. The method for amplifier gain control 500 is performed by a receiver having an RF amplifier configured to receive an RF input signal with variable signal strength, and an IF amplifier coupled to the output of the RF amplifier. Further, at least a part of the method for amplifier gain control 500 may be performed by the receiver system 100. Similar to the three-stage AGC method 400, the method for amplifier gain control 500 balances addition of noise to the received RF signal by the IF amplifier with compression of the received RF signal by the RF amplifier.

The method for amplifier gain control 500 includes a first amplitude threshold of the RF signal strength and a second amplitude threshold of the RF signal strength. The second amplitude threshold is lower than the first amplitude threshold. The first amplitude threshold corresponds to a minimum RF amplifier gain that does not compress the received RF signal. The second amplitude threshold corresponds to an RF signal strength that requires maximum gain for the RF amplifier to maintain a constant output power of the receiver.

Steps 502, 504 and 506 are performed during a time of falling RF signal strength. In the step 502, during a time of falling signal strength, a gain of an IF amplifier is increased as a signal strength of an RF input signal decreases until a first amplitude threshold is reached. The gain of the RF amplifier is held constant during step 502.

In the step 504, if the RF input signal strength decreases beyond the first amplitude threshold, a gain of the RF amplifier is increased until the second amplitude threshold is reached. The gain of the IF amplifier is held constant during step 504.

In the step 506, if the signal strength of the RF input signal decreases beyond the second amplitude threshold, the gain of the IF amplifier is further increased. The gain of the RF amplifier is held constant at the maximum during step 506.

Steps 508, 510 and 512 are performed during a time of rising RF signal strength. In the step 508, during a time of rising signal strength, the gain of the IF amplifier is decreased as the signal strength of the RF input signal increases until the second amplitude threshold is reached. The gain of the RF amplifier is held constant during step 508.

In the step 510, if the signal strength of the RF input signal increases beyond the second amplitude threshold, the gain of the RF amplifier is decreased until the first amplitude threshold is reached. The gain of the IF amplifier is held constant during step 510.

In the step 512, if the strength of the RF input signal increases beyond the first amplitude threshold, then the gain of the IF amplifier is further decreased. The gain of the RF amplifier is held constant at a minimum during step 512.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A receiver for processing a radio frequency (RF) input signal having a variable signal strength, comprising:
an RF amplifier configured to receive and amplify the RF input signal;
an intermediate frequency (IF) amplifier coupled to an output of said RF amplifier;
a controller, wherein gains of said RF amplifier and IF amplifier are controlled by said controller during a period of falling signal strength, such that:
a gain of said IF amplifier is increased as said signal strength falls until a first amplitude threshold is reached for said falling signal strength;
if said signal strength falls beyond said first threshold, a gain of said RF amplifier is increased until a second amplitude threshold is reached, wherein said second amplitude threshold is lower than said first amplitude threshold; and
if said signal strength falls below said second amplitude threshold, the gain of the IF amplifier is further increased.

2. The receiver of claim 1, wherein at least one of said RF amplifier and said IF amplifier is deposited on a substrate.

3. The receiver of claim 1, further comprising a control circuit coupled to an IF amplifier output, wherein said control circuit is configured to control said gains of said RF amplifier and said IF amplifier.

4. An apparatus for receiver gain control, comprising:
a radio frequency (RF) amplifier having an RF amplifier gain;
an intermediate frequency (IF) amplifier having an IF amplifier gain, wherein said IF amplifier is coupled to said RF amplifier;
means for determining a signal strength coupled to said IF amplifier; and
a control circuit coupled to said means for determining a signal strength;
wherein said control circuit:
determines whether the signal strength falls within a first, a second, or a third power range; and
is configured to control the RF amplifier gain and the IF amplifier gain, including:
if said signal strength falls within said first power range, said control circuit adjusts said IF amplifier gain while holding said RF amplifier gain substantially constant;
if said signal strength falls within said second power range, said control circuit adjusts said RF amplifier gain while holding said IF gain substantially constant; and
if said signal strength falls within said third power range, said control circuit adjusts said IF amplifier gain while holding said RF amplifier gain substantially constant.

5. The apparatus of claim 4, wherein said control circuit is part of a receiver.

6. The apparatus of claim 4, wherein at least a part of the apparatus is deposited on a substrate.

7. The apparatus of claim 4, further comprising a front-end amplifier coupled to said IF amplifier, wherein said control circuit is configured to control loading of said front-end amplifier.

8. The apparatus of claim 4, wherein said control circuit compares said signal strength to a reference power level to determine a power error.

9. The apparatus of claim 8, wherein said control circuit varies said IF amplifier gain to minimize said power error.

10. The apparatus of claim 8, wherein said control circuit varies said RF amplifier gain to minimize said power error.

11. The apparatus of claim 4, wherein said control circuit, if said signal strength falls within said first power range, adjusts said IF amplifier gain to a value between a minimum IF amplifier gain and a threshold gain while holding said RF amplifier gain substantially constant at a minimum gain.

12. The apparatus of claim 4, wherein said control circuit, if said signal strength falls within said second power range, adjusts said RF amplifier gain to a value between a minimum and a substantially maximum RF amplifier gain while holding said IF amplifier gain substantially constant at a threshold gain.

13. The apparatus of claim 4, wherein said control circuit, if said signal strength falls within said third power range, adjusts said IF amplifier gain to a value between a threshold gain and a substantially maximum IF amplifier gain while holding said RF amplifier gain substantially constant at a maximum gain.

14. A method of automatic gain control in a receiver having an RF amplifier configured to receive an RF input signal with variable signal strength, and an IF amplifier coupled to the output of the RF amplifier, the method comprising:
   during a time of falling signal strength including a first amplitude threshold and a second amplitude threshold, the second amplitude threshold lower than the first,
      increasing a gain of the IF amplifier as the signal strength of the RF input signal decreases until the first amplitude threshold is reached;
      if the signal strength of the RF input signal decreases beyond the first amplitude threshold, increasing a gain of the RF amplifier until the second amplitude threshold is reached; and
      if the signal strength of the RF input signal decreases beyond the second amplitude threshold, then further increasing the gain of the IF amplifier.

15. The method of claim 14, further comprising the steps of:
   during a time of rising signal strength,
      decreasing said gain of the IF amplifier as the signal strength of the RF input signal increases until the second amplitude threshold is reached;
      if the signal strength of the RF input signal increases beyond the second amplitude threshold, decreasing the gain of the RF amplifier until the first amplitude threshold is reached; and
      if the signal strength of the RF input signal increases beyond the first amplitude threshold, then further decreasing the gain of the IF amplifier.

16. The method of claim 14, wherein the first amplitude threshold corresponds to a minimum RF amplifier gain that does not compress the received RF signal.

17. The method of claim 14, wherein the second amplitude threshold corresponds to an RF signal strength that requires maximum gain for the RF amplifier to maintain a constant output power of the receiver.

18. A method of receiver gain control, comprising:
   determining a strength of a received signal;
   determining whether the signal strength falls within a first, a second, or a third power range; and
   amplifying said received signal, wherein said amplifying includes:
      if said signal strength falls within said first power range, adjusting an intermediate frequency (IF) amplifier gain while holding a radio frequency (RF) amplifier gain substantially constant;
      if said signal strength falls within said second power range, adjusting said RF amplifier gain while holding said IF gain substantially constant; and
      if said signal strength falls within said third power range, adjusting said IF amplifier gain while holding said RF amplifier gain substantially constant.

19. The method of claim 18, further comprising comparing said signal strength to a reference to determine a power error, wherein said amplifying is based on said power error.

20. The method of claim 19, further comprising varying said IF amplifier gain to minimize said power error.

21. The method of claim 19, further comprising varying said RF amplifier gain to minimize said power error.

22. The method of claim 18, wherein in said first power range, said adjusting further comprises varying said IF amplifier gain to a value between a minimum IF amplifier gain and a threshold gain while said RF amplifier gain is held substantially constant at a minimum RF amplifier gain.

23. The method of claim 18 wherein in said second power range, said adjusting further comprises varying said RF amplifier gain to a value between a minimum and a maximum RF amplifier gain while said IF amplifier gain is held substantially constant at a threshold gain.

24. The method of claim 18, wherein in said third power range, said adjusting further comprises varying said IF amplifier gain to a value between a threshold gain and a maximum IF amplifier gain while said RF amplifier gain is held substantially constant at a maximum RF amplifier gain.

* * * * *